(12) United States Patent
Tankielun et al.

(10) Patent No.: US 10,422,823 B2
(45) Date of Patent: Sep. 24, 2019

(54) SYSTEM AND A METHOD FOR DETERMINING A RADIATION PATTERN

(71) Applicant: Rohde & Schwarz GmbH & Co. KG, München (DE)

(72) Inventors: Adam Tankielun, Ottobrunn (DE); Hendrik Bartko, Unterhaching (DE); Corbett Rowell, München (DE)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 353 days.

(21) Appl. No.: 15/371,128

(22) Filed: Dec. 6, 2016

(65) Prior Publication Data

US 2018/0031622 A1 Feb. 1, 2018

Related U.S. Application Data

(60) Provisional application No. 62/369,381, filed on Aug. 1, 2016.

(51) Int. Cl.
*G01R 29/10* (2006.01)
*H01Q 1/40* (2006.01)

(52) U.S. Cl.
CPC .............. *G01R 29/10* (2013.01); *H01Q 1/40* (2013.01)

(58) Field of Classification Search
CPC ....................................................... G01R 29/10
USPC ......................................................... 375/267
See application file for complete search history.

(56) References Cited

U.S. PATENT DOCUMENTS

| 7,876,276 B1* | 1/2011 | Zaman | H01Q 3/08 343/703 |
| 9,391,684 B1* | 7/2016 | Marr | H04B 7/0617 |
| 2015/0116164 A1* | 4/2015 | Mannion | G01R 29/10 343/703 |
| 2016/0054439 A1* | 2/2016 | Brookner | G01S 13/42 342/26 R |

OTHER PUBLICATIONS

Lopez et al., "Extending the Plane Wave Based Fast Irregular Antenna Field Transformation Algorithm for Amplitude-Only Data," 2015 9th European Conference on Antennas and Propagation, EuCAP, pp. 1-3 (Apr. 13-17, 2015).

Razavi et al., "A New Look at Phaseless Planar Near-Field Measurements: Limitations, Simulations, Measurements, and a Hybrid Solution," IEEE Antennas Propagation Magazine, vol. 49, No. 2, pp. 170-178 (Apr. 2007).

(Continued)

*Primary Examiner* — Lihong Yu
(74) *Attorney, Agent, or Firm* — Shumaker & Sieffert, P.A.

(57) ABSTRACT

A system for determining the radiation pattern of an antenna array comprising a plurality of antenna elements comprises a signal generator for generating a test signal, a number of probes for measuring a magnitude of the signals emitted by the antenna elements when driven with the test signal in a first surface and in a second surface, wherein the distance of the first surface to the antenna elements is smaller than the distance of the second surface to the antenna elements, and a pattern calculation unit for calculating the radiation pattern of the antenna array based on the magnitudes measured in the first surface and the second surface.

23 Claims, 6 Drawing Sheets

(56) References Cited

OTHER PUBLICATIONS

Yaghjian, "An Overview of Near-Field Antenna Measurements," IEEE Transactions on Antennas and Propagation, vol. AP-34, No. 1, pp. 30-45 (Jan. 1986).
Extended European search report for European Patent Application No. 17154881.1 (dated Nov. 22, 2017).
Mikulasek et al., "Error Analysis of Phase Retrieval Method Combining Global and Local Approaches," 13th Conference on Microwave Techniques COMITE, pp. 128-133 (Apr. 17-18, 2013).
Razavi et al., "Phaseless Measurements Over Nonrectangular Planar Near-Field Systems Without Probe Corotation," IEEE Transactions on Antennas and Propagation, vol. 61, No. 1, pp. 143-152.
Alvarez et al., "The Sources Reconstruction Method for Amplitude-Only Field Measurements," IEEE Transactions on Antennas and Propagation, vol. 58, No. 8, pp. 2776-2781 (Aug. 2010).
Yaccarino et al., "Microwave Antenna Imaging, Diagnostics, and Phaseless Reconstructions," International Journal of Imaging Systems and Technoclogy, John Wiley & Sons Inc., vol. 8, No. 4, pp. 396-406 (Feb. 25, 1997).

\* cited by examiner

SYSTEM AND A METHOD FOR DETERMINING A RADIATION PATTERN

PRIORITY CLAIM

This application claims the benefit of U.S. Provisional Patent Application Ser. No. 62/369,381, filed Aug. 1, 2016; the disclosure of which is incorporated herein by reference in its entirety.

TECHNICAL FIELD

The invention relates to a system and a method for determining the radiation pattern of an antenna array.

BACKGROUND

Although applicable to any system that uses wireless signals, the present invention will be described in combination with testing of wireless communication devices.

Modern wireless communication devices use radio frequency signals to transmit data and or speech. Manufacturers of such communication devices always try to improve the efficiency of the communication devices and at the same time have to fulfil legal regulations or standard requirements.

Therefore, extensive testing of such communication devices is performed during development, production and after production. Such testing serves quality assurance and compliance tests. One test comprises determining the far field of the antenna array of the respective device.

SUMMARY

There is a need for improved testing of the far field of RF devices.

The invention provides a system for determining the radiation pattern of an antenna array comprising a plurality of antenna elements, i.e. two or more antenna elements. The system comprises a signal generator for generating a test signal, a number, i.e. one or more, of probes for measuring a magnitude of the signals emitted by the antenna elements when driven with the test signal in a first surface and in a second surface, wherein a first distance of the first surface to the antenna elements is smaller than a second distance of the second surface to the antenna elements, and a pattern calculation unit for calculating the radiation pattern of the antenna array based on the magnitudes measured in the first surface and the second surface.

The invention further provides a method for determining the radiation pattern of an antenna array comprising a plurality of antenna elements. The method comprises generating a test signal and driving the antenna elements with the generated test signal, measuring a magnitude of the signals emitted by the antenna elements when driven with the test signal with a number of probes in a first surface and in a second surface, wherein a first distance of the first surface to the antenna elements is smaller than a second distance of the second surface to the antenna elements, and calculating the radiation pattern of the antenna array based on the magnitudes measured in the first surface and the second surface.

In modern communication systems, like e.g. smartphones or other mobile equipment, especially so called 5G equipment, antenna arrays can be used to provide compact antenna systems. Such antenna arrays can perform beam forming and are therefore advantageous for improving the signal quality or signal strength in mobile data communications.

As already stated above, it is necessary to measure the emissions, especially the radiation pattern or far field of the antenna arrays to assure compliance with legal or other rules, like certain standards.

There exist possibilities to calculate the far field from a measurement of the near field including amplitude values and phase values for the single measurements. However, it is technically much more complex to measure the phase of a wireless signal as compared to an amplitude measurement.

The present invention therefore provides a system, which can determine the radiation pattern of an antenna array based only on amplitude measurements.

To calculate the far field based on measurements of the near field, which only comprise amplitude information, the present invention measures the emissions of the antenna elements in a first surface, which has a first distance to the antenna elements, and in a second surface, which has a second distance to the antenna elements. The term surface in this context refers to a virtual surface over which the probe is moved. The surfaces can be planes or any type of curved surfaces in three dimensional space. The surfaces can be formed such that they cut through or wrap around at least 50%, 60%, 70%, 80% or more, e.g. 90% of the total emitted power of the antenna elements.

The pattern calculation unit can e.g. use an extended Plane Wave Based Fast Irregular Antenna Field Transformation Algorithm, FIAFTA, to calculate the antenna pattern, i.e. the far field of the antenna. Such an algorithm is e.g. disclosed in "Extending the Plane Wave Based Fast Irregular Antenna Field Transformation Algorithm for Amplitude-Only Data" by Carlos Lopez et al. The content of the publication is included herein by reference in its entirety. Further explanations of the FIAFTA algorithm can e.g. be found in "An overview of near-field antenna measurements" by A. D. Yaghjian, and "A new look at phaseless planar near-field measurements: limitations, simulations, measurements, and a hybrid solution", IEEE Antennas Propag, vol. 49, no. 2, pp 170-178. The content of the publications is included herein by reference in its entirety.

The present invention therefore provides a system, which can work with simple probes, that only measure magnitudes and not necessarily phases, which is however still possible. Such simple probes are easier to develop and build and therefore not only reduce the complexity of the system but also provide for a more economic system.

Further embodiments of the present invention are subject of the further subclaims and of the following description, referring to the drawings.

In a possible embodiment, the test signal when applied to the antenna elements can drive the antenna elements to emit a static RF signal, i.e. a signal with a constant amplitude, a constant frequency and a constant phase.

In a possible embodiment, the test signal can be provided as a digital command signal to a signal processing unit of the antenna array. The signal processing unit can e.g. be a transceiver of a smartphone or the like, which receives the test signal and generates according to the information in the test signal respective RF signals for driving the single antenna elements.

In a possible embodiment, the test signal can be provided as a RF signal for driving the single antenna elements directly. Directly in this case means that the signal is not transformed e.g. by a transceiver from a command to actual RF signals. Directly can but does not necessarily mean that the signal generator is directly coupled e.g. via a test connector to the antenna array.

In a possible embodiment, the first distance of the first surface to the antenna elements can be such that the measured magnitudes allow differentiating the single antenna elements. Further the second distance of the second surface can be such that the measured magnitudes do not allow differentiating the single antenna elements. If the measured magnitudes allow differentiating the single antenna elements, the effect of every single antenna element can be measured in detail. In contrast, at the second distance the superimposed resulting field can be measured. These two different types of information provide a solid base for later calculating the far-field of the antenna array.

In a possible embodiment, the first distance can be smaller than $$\frac{\lambda_0}{2},$$

wherein $\lambda_0$ is the wavelength of the test signal. The second distance can be greater than $$\frac{\lambda_0}{2}.$$

In a possible embodiment, the first distance can be between $\Delta d$ and two times $\Delta d$, wherein $\Delta d$ is the distance of the single antenna elements in the antenna array. The second distance can be greater than two times $\Delta d$. It is understood, that the first and the second distance can be variable, i.e. not constant. This also implies, that the surfaces are not spaced apart equidistantly from the antenna array at all points. This can especially be the case with curved surfaces, like e.g. cylinder walls of cylinders with an elliptical or round ground surface.

In a possible embodiment, the antenna array can comprises a radom and the first distance can be the distance of the radom's outer surface to the antenna array. That means that the probes can slide over the outer surface of the radom or be almost in contact with the radom.

In a possible embodiment, the aperture of the probes used at the first distance can be smaller than the aperture of the probes used at the second distance.

In a possible embodiment, the aperture of the probes used at the first distance can be defined as the distance of the two end points of an arc segment in the first distance or the second distance, respectively. The arc segment can comprise an angle $$\alpha = \tan^{-1}\left(\frac{\lambda_0}{L_{max}}\right)$$

wherein $\lambda_0$ is the wavelength of the test signal, and $L_{max}$ is the radius of the smallest sphere, which surrounds the antenna array, or the device carrying the antenna array.

In a possible embodiment, the aperture of the probes used at the first distance an be defined as $$W_{D1} \leq \frac{\lambda_0}{2}$$

wherein $\lambda_0$ is the wavelength of the test signal.

In a possible embodiment, the aperture of the probes used at the second distance can be defined as $$W_{D2} \leq D_2 * \tan\alpha, \text{ with}$$

$$\alpha = \tan^{-1}\left(\frac{\lambda_0}{L_{max}}\right)$$

wherein D2 is the second distance, $\lambda_0$ is the wavelength of the test signal, and $L_{max}$ is the radius of the smallest sphere, which surrounds the antenna array or the device carrying the antenna array.

In a possible embodiment, the first surface and/or the second surface comprise at least a section of a sphere and/or an ellipsoid and/or a cylinder, especially wherein the first surface and/or the second surface comprise different shapes.

In a possible embodiment, the system can comprise a mechanical structure, which is rotatable around a first axis and comprises at least one probe at the first distance from the first axis and at least on other probe at the second distance from the first axis. The mechanical structure can e.g. comprise the probes in the first and the second distance on opposing sides of the first axis and directed to the firs axis. The mechanical structure can further comprise probes which are placed on an imaginary top or bottom of the cylinder formed by the probes in the first distance, when rotating the mechanical structure. When the mechanical structure is rotated around the first axis, the probes at the first and second distance each move on a cylinder wall, while the probes centered on the first axis cover the top and bottom of the cylinder provided by the first distance. The mechanical structure therefore allows recording the necessary details with just a single rotation, while the device under test is placed on the first axis.

It is understood that any other mechanical construction can also be used. For example a robot arm like construction can be used to move a probe around a device under test.

The subject matter described herein may be implemented in hardware, software, firmware, or any combination thereof. As such, the terms "function" "node" or "module" as used herein refer to hardware, which may also include software and/or firmware components, for implementing the feature being described. In one exemplary implementation, the subject matter described herein may be implemented using a computer readable medium having stored thereon computer executable instructions that when executed by the processor of a computer control the computer to perform steps. Exemplary computer readable media suitable for implementing the subject matter described herein include non-transitory computer-readable media, such as disk memory devices, chip memory devices, programmable logic devices, and application specific integrated circuits. In addition, a computer readable medium that implements the subject matter described herein may be located on a single device or computing platform or may be distributed across multiple devices or computing platforms.

BRIEF DESCRIPTION OF THE DRAWINGS

For a more complete understanding of the present invention and advantages thereof, reference is now made to the following description taken in conjunction with the accompanying drawings. The invention is explained in more detail below using exemplary embodiments which are specified in the schematic figures of the drawings, in which.

In the figures like reference signs denote like elements unless stated otherwise.

DETAILED DESCRIPTION OF THE DRAWINGS

Figure 1:
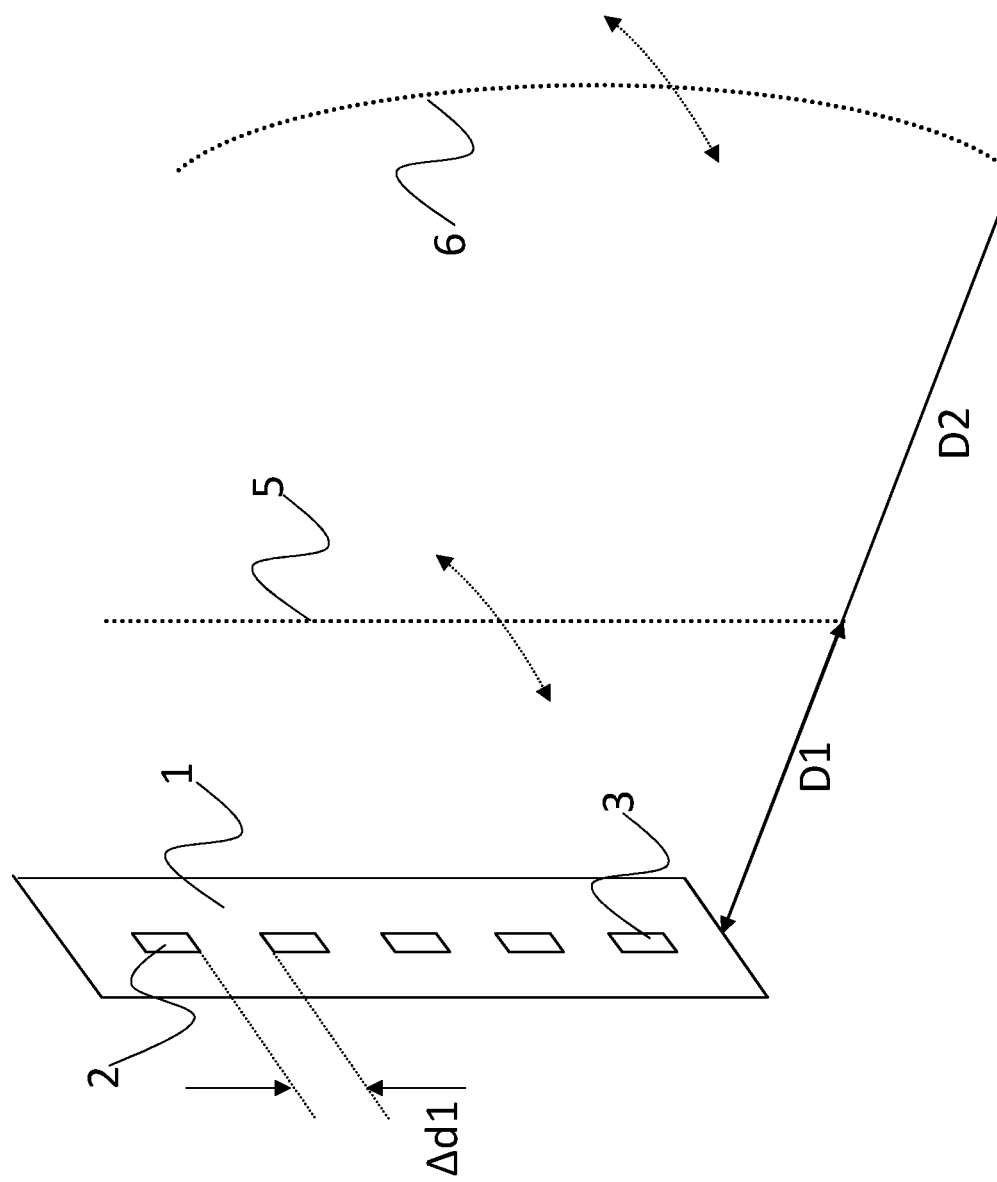
FIG. 1 shows a block diagram of an antenna array for use with the present invention.

FIG. 1 shows an antenna array 1, which comprises five antenna elements 2, 3. For sake of simplicity only the first and the last antenna elements 2, 3 are provided with reference signs.

The antenna elements 2, 3 are arranged in a single column. That means that the antenna array 1 is a one dimensional antenna array 1, where the single antenna elements 2, 3 are positioned on a vertical axis. The single antenna elements 2, 3 are positioned apparat at a distance Δd1.

In FIG. 1 a first surface 5 is indicated by a dotted line at a first distance D1 from the antenna array 1. Further, a second surface 6 is indicated by a dotted line at a second distance D2 from the antenna array 1. The two surfaces 5, 6 are formed by rotating (hinted at by arrows) the dotted lines around the center axis of the antenna array, or any other adequate axis.

It can be seen in FIG. 1 that the two surfaces 5, 6 do no need to have the same shape. Here the first surface 5 has a cylindrical shape, while the second surface 6 has a spherical shape. It is noted that any combination of shapes is possible.

The measurement can be performed by rotating the dotted lines 360° around the respective axis. However, it is not necessary to rotate the dotted lines 360°. A smaller rotation can be performed under the condition that a predetermined amount of the power emitted by the antenna elements 2, 3 is included in the respective surface 5, 6. The more of the emitted power is included in the surfaces, the better will be the accuracy of the calculated far field.

Figure 2:
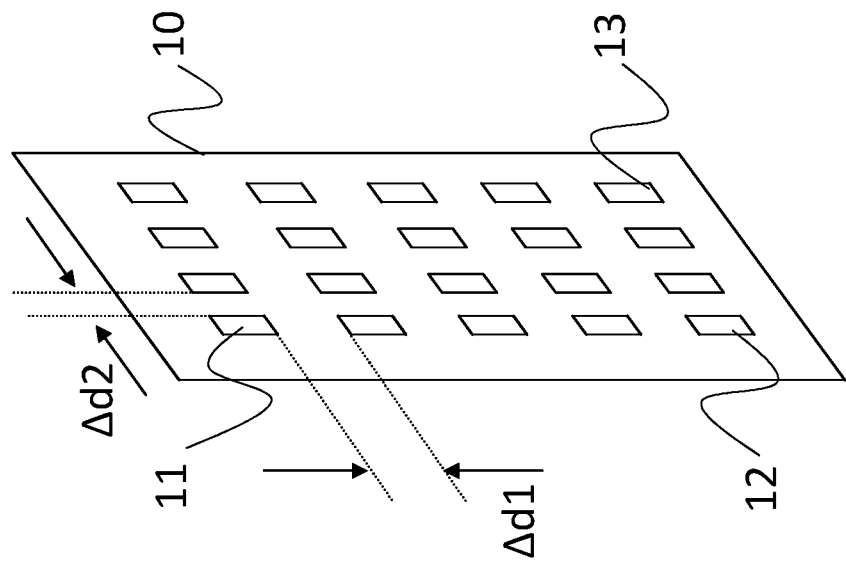
FIG. 2 shows a block diagram of another antenna array for use with the present invention.

FIG. 2 shows another antenna array 10 for use with the present invention. The antenna array 10 comprises antenna elements 11, 12, 13, which are provided in four columns and five rows, i.e. 20 antenna elements 11, 12, 13.

It can be seen in FIG. 2 that the vertical distance Δd1 of the antenna elements 11, 12, 13 is greater than the horizontal distance Δd2 of the antenna elements 11, 12, 13.

If the system of the present invention is used with such an antenna array 10, all values, which are calculated based on the distance Δd1, Δd2 can e.g. be calculated based on the smaller one of the distances.

Figure 3:
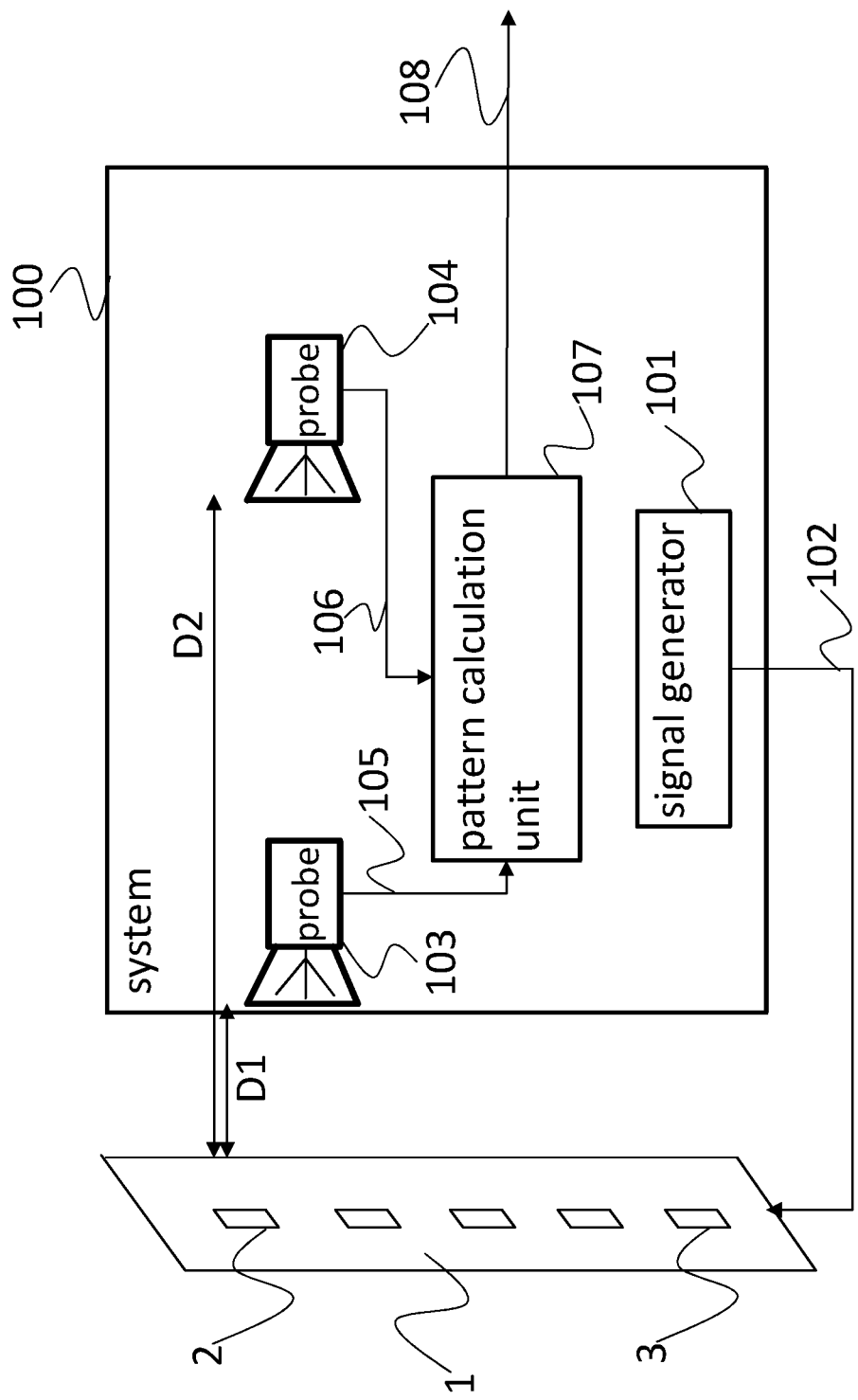
FIG. 3 shows a block diagram of an embodiment of a system according to the present invention.

FIG. 3 shows a system 100 for determining the radiation pattern of an antenna array 1 comprising a plurality of antenna elements 2, 3, as shown in FIG. 1. It is understood, that the system 100 can be used with any other antenna array.

The system 100 comprises a signal generator 101, which generates a test signal 102 for driving the single antenna elements 2, 3. The test signal 102 drives the antenna elements 2, 3 to emit a static RF signal, i.e. a RF signal with constant amplitude, phase and frequency.

The test signal 102 can e.g. be provided as a digital command signal to a signal processing unit (not separately shown) of the antenna array 1. Such a command signal will provide the signal processing unit, e.g. a transceiver, with the necessary information to drive the antenna elements 2, 3 with the respective RF signal. As an alternative, the test signal 102 can be provided as a RF signal for driving the single antenna elements 2, 3. In this case, the RF signal is generated in the signal generator 101 instead of the signal processing unit.

The system 100 further comprises two probes 103, 104. The number of two probes 103, 104 is chosen just exemplarily and any number of probes can be used in the system 100. The probes 103, 104 measure the magnitudes 105, 106 of the signals emitted by the single antenna elements 2, 3.

The probes 103, 104 are positioned at two different distances D1, D2 from the antenna array 1 and measure a magnitude of the signals emitted by the antenna elements 2, 3 when driven with the test signal 102.

The probes 103, 104 are movable relative to the antenna array 1. Movable relatively to means that either the probes 103, 104, the antenna array 1 or both can be moved. With movement the probe 103 performs a scan over a first surface, see 5 in FIG. 1. The probe 104 performs a scan over a second surface, see 6 in FIG. 1.

The distance D1 of the first surface 5 to the antenna elements 2, 3 is smaller than the distance D2 of the second surface 6 to the antenna elements 2, 3.

The first surface 5, and the second surface 6 can be of any shape. They can especially comprise at least a section of a sphere, an ellipsoid, or a cylinder. The first surface 5 and the second surface 6 can especially comprise different shapes.

The distance D1 of the first surface 5 to the antenna array 1 or the antenna elements 2, 3 can be such that the measured magnitudes 105 allow differentiating the single antenna elements. At the same time the distance of the second surface 6 to the antenna array 1 or the antenna elements 2, 3 can be such that the measured magnitudes 106 do not allow differentiating the single antenna elements 2, 3.

The first distance can especially be between the distance Δd of the single antenna elements 2, 3, and two times Δd. As already explained above with reference to FIG. 2, if two different distances exist between the single antenna elements 2, 3, the smaller distance can be chosen as Δd. Some antenna arrays 1 comprises a cover, also called radom. With such an antenna array 1 the first distance D1 can be the distance of the radom's outer surface to the antenna array 1.

The probes 103, 104 can e.g. comprise antennas. The aperture of the probes 103, i.e. the respective antennas, used at the first distance D1 can be smaller than the aperture of the probes 104 used at the second distance D2.

The aperture of the probes 103, 104 can e.g. be defined as the distance of the two end points of an arc segment in the first distance or the second distance, respectively, the arc segment comprising an angle $$\alpha = \tan^{-1}\left(\frac{\lambda_0}{L_{max}}\right)$$

wherein $\lambda_0$ is the wavelength of the test signal, and $L_{max}$ is the radius of the smallest sphere, which surrounds the antenna array 1, 10. This calculation will further be explained with reference to FIG. 6.

An alternate form of calculating the apertures of the probes 103 used at the first distance D1 is defined as $$W_{D1} \leq \frac{\lambda_0}{2}$$

wherein $\lambda_0$ is the wavelength of the test signal 102. In this case, the apertures of the probes 104 used at the second distance D2 can be defined as $$W_{D2} \leq D_2 * \tan\alpha, \text{ with}$$

$$\alpha = \tan^{-1}\left(\frac{\lambda_0}{L_{max}}\right)$$

wherein D2 is the second distance, $\lambda_0$ is the wavelength of the test signal, and $L_{max}$ is the radius of the smallest sphere, which surrounds the antenna array. This calculation will also be further explained with reference to FIG. 6.

The system 100 further comprises a pattern calculation unit 107 for calculating the radiation pattern 108 of the antenna array 1 based on the magnitudes 105, 106 measured in the first distance D1 and the second distance D2.

The pattern calculation unit 107 can e.g. use an extended Plane Wave Based Fast Irregular Antenna Field Transformation Algorithm, FIAFTA, to calculate the antenna pattern, i.e. the far field of the antenna. Such an algorithm is e.g. disclosed in "Extending the Plane Wave Based Fast Irregular Antenna Field Transformation Algorithm for Amplitude-Only Data" by Carlos Lopez et al. The content of the publication is included herein by reference in its entirety. Further explanations of the FIAFTA algorithm can e.g. be found in "An overview of near-field antenna measurements" by A. D. Yaghjian, and "A new look at phaseless planar near-field measurements: limitations, simulations, measurements, and a hybrid solution", IEEE Antennas Propag, vol. 49, no. 2, pp 170-178. The content of the publications is included herein by reference in its entirety.

Figure 4:
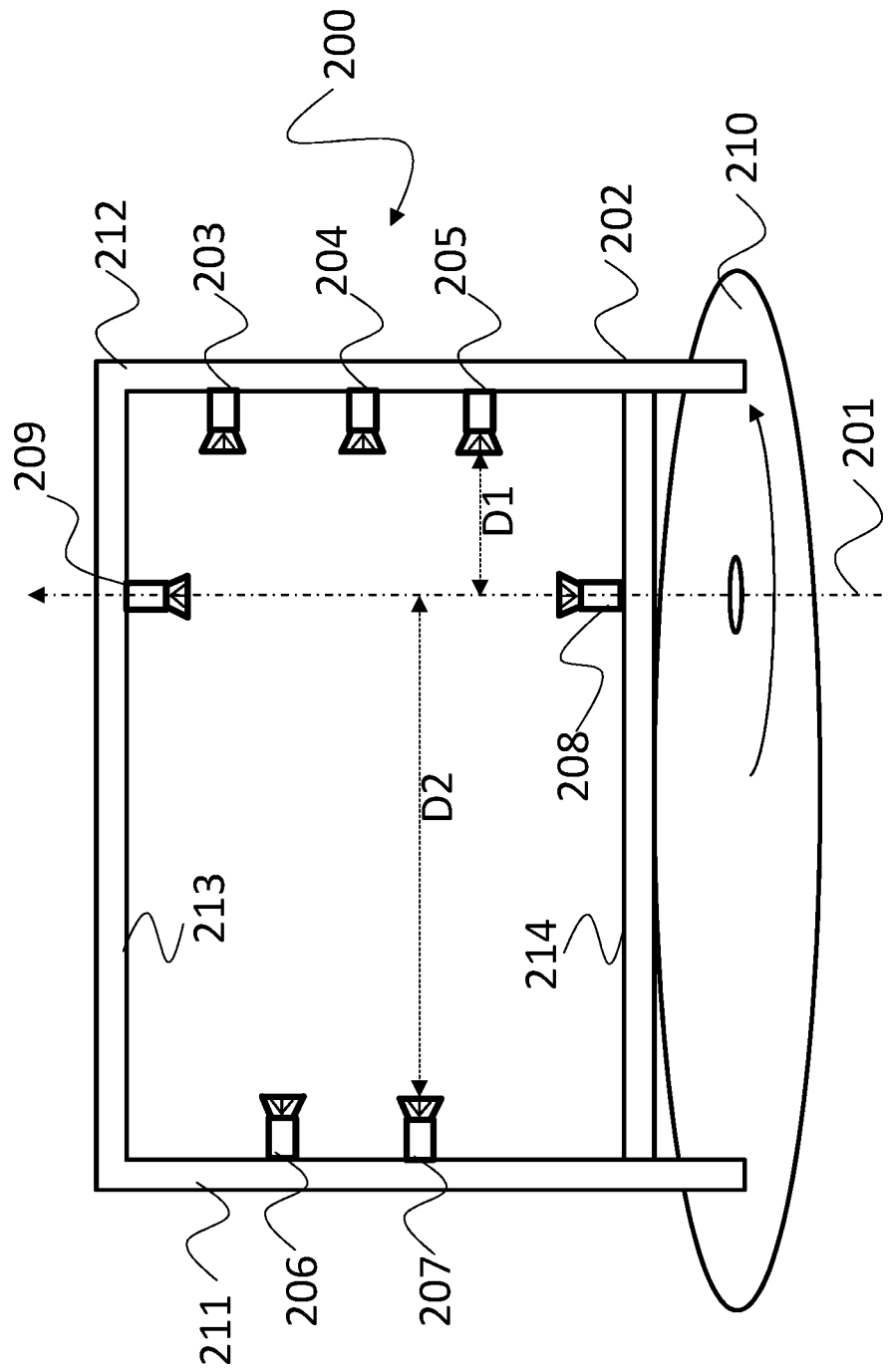
FIG. 4 shows a block diagram of another embodiment of a system according to the present invention.

FIG. 4 shows a block diagram of another system 200 for determining the radiation pattern of an antenna array comprising a plurality of antenna elements. In FIG. 4 no antenna array is shown but can be placed on the axis 201 for testing purpose.

Instead a mechanical structure 202 is shown, which forms a kind of portal. That means that the mechanical structure 202 is mounted on a ground plate 210, and comprises two side posts 211, 212, where one vertical post 214 connects the side posts 211, 212 on their lower end, and one vertical post 215 connects the side posts 211, 212 on their upper end.

The mechanical structure 202 is mounted rotatable around an axis 201. The axis 201 is not positioned in the center of the ground plate 210. Instead the axis 201 is positioned eccentrically. That means that the first post 212 is spaced apart from the axis 201 by the first distance D1. The second post 211 is spaced apart from the axis 201 by the second distance D2. When the ground plate 210 rotates, the post 212 will perform a circular movement around any device under test, DUT, positioned on or near the axis 201 in the first distance D1. The post 211 will perform a circular movement around the DUT in the second distance D2.

On the posts 211, 212 probes 203 to 207 are positioned such that they move around the DUT in the respective distance D1, D2, when the mechanical structure 201 rotates. On the vertical posts 213, 214 probes 208, 209 are mounted on or near the axis 201 and therefore cover the top and bottom of the DUT. All probes 203 to 209 are focused to the axis 201, i.e. the DUT.

The mechanical structure of FIG. 4 can e.g. be part of a system according to FIG. 3. It is understood, that the arrangement of the probes 203 to 209 is just exemplary. Any number of probes can be placed at any post 211, 212, 213, 214 of the mechanical structure 200 as is adequate for the respective DUT. Further, any part of the mechanical structure 200 can be modified. For example the ground plate 210 can be exchanged for the lower vertical post 214 or vertical posts can be omitted. Any mechanical structure that allows rotating probes at different distances at the same time serves the purpose of the mechanical structure 200.

Figure 5:
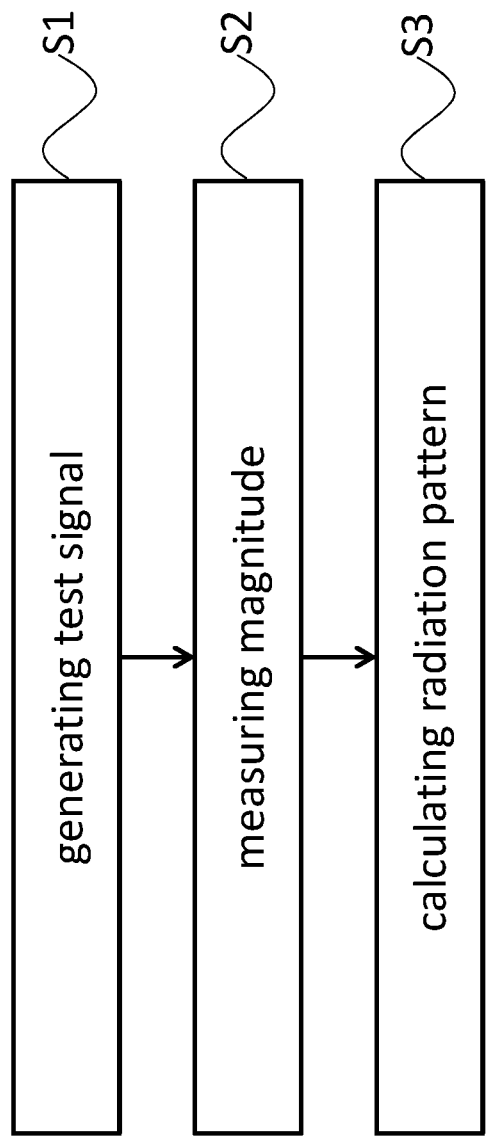
FIG. 5 shows a flow diagram of an embodiment of a method according to the present invention.

FIG. 5 shows a flow diagram of a method for determining the radiation pattern 108 of an antenna array 1, 10 comprising a plurality of antenna elements 2, 3, 11, 12, 13.

The method comprises generating S1 a test signal 102 and driving the antenna elements 2, 3, 11, 12, 13 with the generated test signal 102. The test signal 102 when applied to the antenna elements 2, 3, 11, 12, 13 can drive the antenna elements 2, 3, 11, 12, 13 to emit a static RF signal. The test signal 102 can be e.g. a digital command signal to a signal processing unit of the antenna array 1, 10 to generate the respective RF signals. Alternatively, the test signal 102 can be provided as a RF signal for driving the single antenna elements 2, 3, 11, 12, 13 directly.

Further, a magnitude 105, 106 of the signals emitted by the antenna elements 2, 3, 11, 12, 13 when driven with the test signal 102 is measured S2 with a number of probes 103, 104, 203 to 209 in a first surface 5 and in a second surface 6. A first distance D1 of the first surface 5 to the antenna elements 2, 3, 11, 12, 13 is smaller than a second distance D2 of the second surface 6 to the antenna elements 2, 3, 11, 12, 13. The first surface and the second surface can comprise at least a section of a sphere, an ellipsoid or a cylinder, and the first surface and the second surface can comprise different shapes.

The first distance D1 of the first surface to the antenna elements 2, 3, 11, 12, 13 can be such that the measured magnitudes 105, 106 allow differentiating the single antenna elements 2, 3, 11, 12, 13. Further, the distance D2 of the second surface can be such that the measured magnitudes 105, 106 do not allow differentiating the single antenna elements 2, 3, 11, 12, 13 anymore.

The first distance D1 can e.g. be between $\Delta d$ and two times $\Delta d$, wherein $\Delta d$ is the distance of the single antenna elements 2, 3, 11, 12, 13 to each other. If the antenna array 1, 10 comprises a radom, the first distance D1 can be the distance of the radom's outer surface to the antenna array 1, 10.

The probes 103, 104, 203 to 209 can e.g. be antennas. The aperture of the probes 103, 104, 203 to 209 used at the first distance D1 can then be smaller than the aperture of the probes 103, 104, 203 to 209 used at the second distance D2.

For example, the aperture of the probes 103, 104, 203 to 209 used at the first distance D1 or the second distance D2, respectively, can be defined as the distance of the two end points of an arc segment in the first distance D1 or the second distance D2, respectively, the arc segment comprising an angle $$\alpha = \tan^{-1}\left(\frac{\lambda_0}{L_{max}}\right)$$

wherein $\lambda_0$ is the wavelength of the test signal 102, and $L_{max}$ is the radius of the smallest sphere, which surrounds the antenna array 1, 10.

An alternative formula for the aperture of the probes 103, 104, 203 to 209 used at the first distance D1 is $$W_{D1} \leq \frac{\lambda_0}{2}$$

wherein $\lambda_0$ is the wavelength of the test signal 102.

For the aperture of the probes 103, 104, 203 to 209 used at the second distance D2 the alternative formulation is $$W_{D2} \leq D_2 * \tan\alpha, \text{ with}$$

$$\alpha = \tan^{-1}\left(\frac{\lambda_0}{L_{max}}\right)$$

wherein D2 is the second distance, $\lambda_0$ is the wavelength of the test signal 102, and $L_{max}$ is the radius of the smallest sphere, which surrounds the antenna array 1, 10.

Finally, the radiation pattern 108 of the antenna array 1, 10 is calculated S3 based on the magnitudes 105, 106 measured in the first surface and the second surface.

Figure 6:
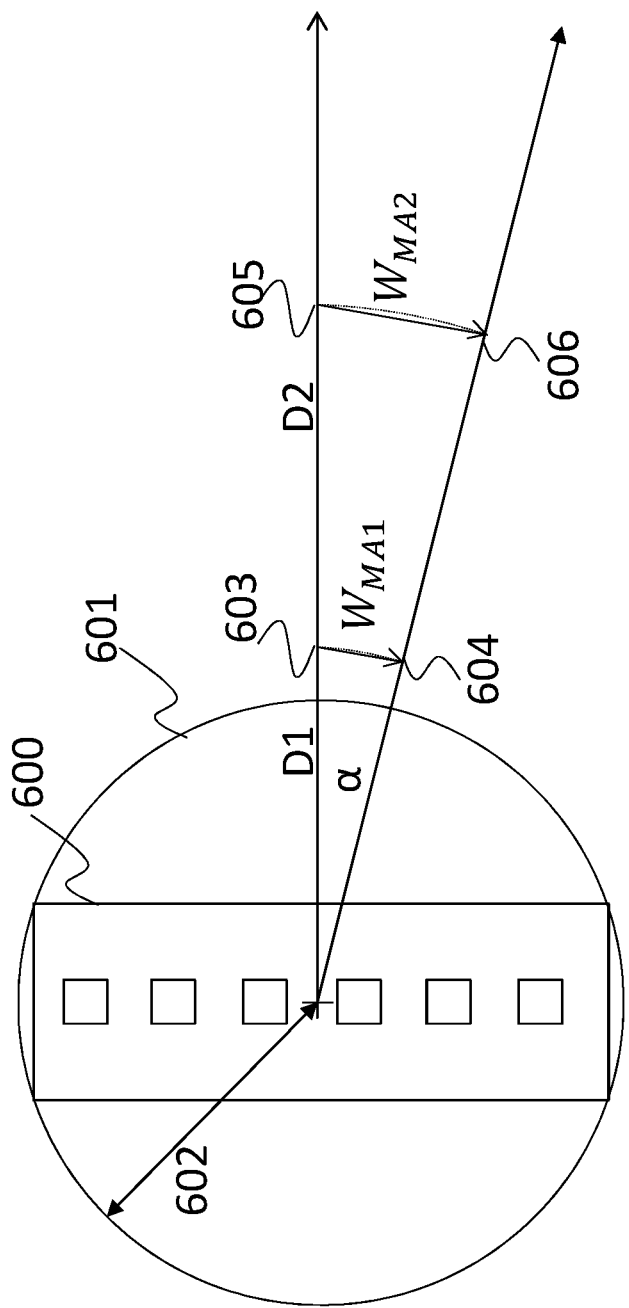
FIG. 6 shows a diagram of another antenna array.

FIG. 6 shows a diagram of another antenna array 600. The antenna array 600 is surrounded by the smallest circle 601, which can fit around the antenna array 600. The circle has the diameter 602.

The diagram of FIG. 6 serves to explain forms of calculating the aperture of the probes used for measuring the emissions of the antenna array 600.

An arc segment with the angle $\alpha$ is drawn in the diagram. The angle $\alpha$ can be calculated as follows:

$$\alpha = \tan^{-1}\left(\frac{\lambda_0}{L_{max}}\right)$$

wherein $L_{max}$ is the radius of the circle 601.

The aperture of probes used at distance D1 can now be calculated as being smaller than $$\frac{\lambda_0}{2}$$

The aperture of probes used at distance D1 can now be calculated as being $D_2 * \tan\alpha$ As an alternative, the apertures of the respective probes can be as large, as the distance between the end points 603, 604 or 605, 606 of the respective arc segment.

As an alternative, a smallest circle around the complete DUT can be used as the basis for the above calculations.

Although specific embodiments have been illustrated and described herein, it will be appreciated by those of ordinary skill in the art that a variety of alternate and/or equivalent implementations exist. It should be appreciated that the exemplary embodiment or exemplary embodiments are only examples, and are not intended to limit the scope, applicability, or configuration in any way. Rather, the foregoing summary and detailed description will provide those skilled in the art with a convenient road map for implementing at least one exemplary embodiment, it being understood that various changes may be made in the function and arrangement of elements described in an exemplary embodiment without departing from the scope as set forth in the appended claims and their legal equivalents. Generally, this application is intended to cover any adaptations or variations of the specific embodiments discussed herein.

In the foregoing detailed description, various features are grouped together in one or more examples or examples for the purpose of streamlining the disclosure. It is understood that the above description is intended to be illustrative, and not restrictive. It is intended to cover all alternatives, modifications and equivalents as may be included within the scope of the invention. Many other examples will be apparent to one skilled in the art upon reviewing the above specification.

Specific nomenclature used in the foregoing specification is used to provide a thorough understanding of the invention. However, it will be apparent to one skilled in the art in light of the specification provided herein that the specific details are not required in order to practice the invention. Thus, the foregoing descriptions of specific embodiments of the present invention are presented for purposes of illustration and description. They are not intended to be exhaustive or to limit the invention to the precise forms disclosed; obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. Throughout the specification, the terms "including" and "in which" are used as the plain-English equivalents of the respective terms "comprising" and "wherein," respectively. Moreover, the terms "first," "second," and "third," etc., are used merely as labels, and are not intended to impose numerical requirements on or to establish a certain ranking of importance of their objects.

The invention claimed is:

1. A system for determining the radiation pattern of an antenna array comprising a plurality of antenna elements, the system comprising:
   a signal generator for generating a test signal,
   a number of probes for measuring a magnitude of the signals emitted by the antenna elements when driven with the test signal in a first surface and in a second surface, wherein a first distance of the first surface to the antenna elements is smaller than a second distance of the second surface to the antenna elements, and wherein the aperture of the probes used at the first distance is smaller than the aperture of the probes used at the second distance, and
   a pattern calculation unit for calculating the radiation pattern of the antenna array based on the magnitudes measured in the first surface and the second surface.

2. The system of claim 1, wherein the test signal when applied to the antenna elements drives the antenna elements to emit a static radio frequency (RF) signal.

3. The system of claim 1, wherein the test signal is provided as a digital command signal to a signal processing unit of the antenna array.

4. The system of claim 1, wherein the test signal is provided as a RF signal for driving each of the antenna elements directly.

5. The system of claim 1, wherein the distance of the first surface to the antenna elements is such that the measured magnitudes allow differentiating the antenna elements and the distance of the second surface is such that the measured magnitudes do not allow differentiating the antenna elements.

6. The system of claim 1, wherein the first distance is between Δd and two times Δd, wherein Δd is the distance between the antenna elements in the antenna array.

7. The system of claim 1, wherein the antenna array comprises a radom and the first distance is the distance of the radom's outer surface to the antenna array.

8. The system of claim 1, wherein the aperture of the probes used at the first distance or the second distance is defined as the distance of the two end points of an arc segment in the first distance or the second distance, respectively, the arc segment comprising an angle $$\alpha = \tan^{-1}\left(\frac{\lambda_0}{L_{max}}\right)$$

wherein $\lambda_0$ is the wavelength of the test signal, and $L_{max}$ is the radius of the smallest sphere, which surrounds the antenna array.

9. The system of claim 1, wherein the aperture of the probes used at the first distance is defined as $$W_{D1} \leq \frac{\lambda_0}{2}$$

wherein $\lambda_0$ is the wavelength of the test signal.

10. The system of claim 1, wherein the aperture of the probes used at the second distance is defined as $$W_{D2} \leq D_2 * \tan\alpha, \text{ with}$$

$$\alpha = \tan^{-1}\left(\frac{\lambda_0}{L_{max}}\right)$$

wherein D2 is the second distance, $\lambda_0$ is the wavelength of the test signal, and $L_{max}$ is the radius of the smallest sphere, which surrounds the antenna array.

11. The system of claim 1, wherein the first surface and/or the second surface comprise at least a section of a sphere and/or an ellipsoid and/or a cylinder, especially wherein the first surface and/or the second surface comprise different shapes.

12. The system of claim 1, comprising a mechanical structure, which is rotatable around a first axis and comprises at least one probe at the first distance from the first axis and at least on other probe at the second distance from the first axis.

13. A method for determining the radiation pattern of an antenna array comprising a plurality of antenna elements, the method comprising:
generating a test signal and driving the antenna elements with the generated test signal,
measuring a magnitude of the signals emitted by the antenna elements when driven with the test signal with a number of probes in a first surface and in a second surface, wherein a first distance of the first surface to the antenna elements is smaller than a second distance of the second surface to the antenna elements, and wherein the aperture of the probes used at the first distance is smaller than the aperture of the probes used at the second distance, and
calculating the radiation pattern of the antenna array based on the magnitudes measured in the first surface and the second surface.

14. The method of claim 13, wherein the test signal when applied to the antenna elements drives the antenna elements to emit a static radio frequency (RF) signal.

15. The method of claim 13, wherein the test signal comprises a digital command signal to a signal processing unit of the antenna array.

16. The method of claim 13, wherein the test signal is provided as a RF signal for driving each of the antenna elements directly.

17. The method of claim 13, wherein the distance of the first surface to the antenna elements is such that the measured magnitudes allow differentiating the antenna elements and the distance of the second surface is such that the measured magnitudes do not allow differentiating the antenna elements.

18. The method of claim 13, wherein the first distance is between Δd and two times Δd, wherein Δd is the distance between the antenna elements in the antenna array.

19. The method of claim 13, wherein the antenna array comprises a radom and the first distance is the distance of the radom's outer surface to the antenna array.

20. The method of claim 13, wherein the aperture of the probes used at the first distance or the second distance, respectively, is defined as the distance of the two end points of an arc segment in the first distance or the second distance, respectively, the arc segment comprising an angle $$\alpha = \tan^{-1}\left(\frac{\lambda_0}{L_{max}}\right)$$

wherein $\lambda_0$ is the wavelength of the test signal, and $L_{max}$ is the radius of the smallest sphere, which surrounds the antenna array.

21. The method of claim 13, wherein the aperture of the probes used at the first distance is defined as $$W_{D1} \leq \frac{\lambda_0}{2}$$

wherein $\lambda_0$ is the wavelength of the test signal.

22. The method of claim 13, wherein the aperture of the probes used at the second distance is defined as $$W_{D2} \leq D_2 * \tan\alpha, \text{ with}$$

$$\alpha = \tan^{-1}\left(\frac{\lambda_0}{L_{max}}\right)$$

wherein D2 is the second distance, $\lambda_0$ is the wavelength of the test signal, and $L_{max}$ is the radius of the smallest sphere, which surrounds the antenna array.

23. The method of claim 13, wherein the first surface and/or the second surface comprise at least a section of a sphere and/or an ellipsoid and/or a cylinder, especially wherein the first surface and/or the second surface comprise different shapes.

* * * * *